US009089025B2

(12) United States Patent
Neyman et al.

(10) Patent No.: US 9,089,025 B2
(45) Date of Patent: Jul. 21, 2015

(54) 1-WIRE COMMUNICATION PROTOCOL AND INTERFACE CIRCUIT FOR HIGH VOLTAGE APPLICATIONS

(71) Applicant: IXYS Corporation, Milpitas, CA (US)

(72) Inventors: Leonid A. Neyman, Sunnyvale, CA (US); Allan Ming-Lun Lin, Pleasanton, CA (US)

(73) Assignee: IXYS Corporation, Milpitas, CA (US)

( * ) Notice: Subject to any disclaimer, the term of this patent is extended or adjusted under 35 U.S.C. 154(b) by 362 days.

(21) Appl. No.: 13/647,139

(22) Filed: Oct. 8, 2012

(65) Prior Publication Data

US 2013/0028338 A1    Jan. 31, 2013

Related U.S. Application Data

(63) Continuation-in-part of application No. 12/696,987, filed on Jan. 29, 2010, now Pat. No. 8,324,824.

(51) Int. Cl.
*H05B 41/16* (2006.01)
*H05B 33/08* (2006.01)
*H03K 7/08* (2006.01)
*H05B 37/02* (2006.01)
*H04L 25/49* (2006.01)

(52) U.S. Cl.
CPC .............. *H05B 33/0818* (2013.01); *H03K 7/08* (2013.01); *H04L 25/4902* (2013.01); *H05B 37/0254* (2013.01); *Y02B 20/346* (2013.01)

(58) Field of Classification Search
USPC ......... 315/247, 291, 294, 307, 308, 312, 317, 315/360
See application file for complete search history.

(56) References Cited

U.S. PATENT DOCUMENTS

| 2004/0155609 | A1 | 8/2004 | Lys et al. |
| 2004/0160199 | A1 | 8/2004 | Morgan et al. |
| 2006/0082331 | A1 | 4/2006 | Ashdown |
| 2007/0029946 | A1* | 2/2007 | Yu et al. ..................... 315/291 |
| 2007/0285031 | A1* | 12/2007 | Shteynberg et al. .......... 315/294 |

OTHER PUBLICATIONS

Notice of Allowance for U.S. Appl. No. 12/696,987 (Aug. 3, 2012).
Office Action for U.S. Appl. No. 12/696,987 (Feb. 3, 2012).

* cited by examiner

*Primary Examiner* — Douglas W Owens
*Assistant Examiner* — Jianzi Chen
(74) *Attorney, Agent, or Firm* — Imperium Patent Works (57) ABSTRACT

A system for communicating with a host using control signals over a 1-wire interface is disclosed. The system includes a driver coupled to the host by the 1-wire interface. Control signals are transmitted from the host to the driver for decoding by the driver controller. The control signals are pulse width modulation format signals which are interpreted by the driver as binary encoded command mode signals or analog encoded command mode signals, depending upon when the signals are received in relation to a preamble pulse and a post-amble pulse.

27 Claims, 8 Drawing Sheets

1-WIRE COMMUNICATION PROTOCOL AND INTERFACE CIRCUIT FOR HIGH VOLTAGE APPLICATIONS

CROSS-REFERENCE TO RELATED APPLICATION

This patent application is a continuation-in-part of U.S. patent application Ser. No. 12/696,987, filed Jan. 29, 2010, entitled "1-Wire Communication Protocol and Interface Circuit."

BACKGROUND OF THE INVENTION

This invention relates to a communication protocol and interface circuit for communication between a host device and a driver device using a single wire interface, more commonly known as a 1-wire interface.

Light-emitting diodes (LEDs) are being used increasingly in display devices and numerous lighting applications. For example, some liquid crystal display (LCD) devices use white LEDs as the backlight for the LCD display. These LEDs are typically driven by an LED driver that functions as a constant current device to supply a constant sink current fed through the LEDs to provide a constant luminescence. Alternatively they can function as an average current device to supply a switching pulse width modulation sink current fed through the LEDs to provide a dimming luminescence. The amount of constant sink current driving the LEDs by the LED driver is typically controlled by a host controller residing in an electronic device (e.g., a mobile telephone, computer, etc.) that utilizes the LEDs.

The host controller interfaces with the processor of the electronic device to provide pulse width modulation (PWM) commands directing the average intensity of illumination to be generated by the LED driver, and sends the PWM signals to the LED driver to adjust the average current for driving the LEDs. The host controller also communicates with the LED driver to send a variety of commands to the LED driver to program the LED driver. These commands include commands for setting the DC current to be provided by the LED driver to the LEDs.

Conventional communication protocols and interface circuitry between a host controller and a LED driver require two separate communication channels (e.g., two wires, each wire with its own set of integrated circuit pins) for communication of the PWM signals and the commands for programming the LED driver. Conventional 1-wire communication protocols are typically used by the host controller to communicate commands for programming the LED driver based on the number of pulses sent via the 1-wire interface. All pulses sent over the conventional 1-wire interface are typically interpreted as commands. The conventional 1-wire communication protocols cannot be used for dynamic communication of PWM signals to adjust the average current for driving the LEDs. Thus, in addition to the pin used by the 1-wire interface to receive commands from the host controller, conventional LED drivers require an additional control pin on the LED driver integrated circuit (IC) to receive PWM pulses for adjusting the average LED drive current. This adds to the complexity and manufacturing cost of the LED driver and host controller ICs.

SUMMARY OF THE INVENTION

Embodiments of the invention provide a 1-wire communication protocol and interface circuitry for communication between a host device (e.g., host controller) and a driver device (e.g., LED driver). The 1-wire communication protocol enables PWM formatted signals sent over the same 1-wire interface from the host to be interpreted as different types of information, for example, as binary encoded command mode signals and analog encoded command mode signals. The binary encoded commands are preferably used by the receiver as programming information, while the analog encoded command mode can be used to send analog values to the receiver, e.g. for DC current setting commands) for programming the LED driver. The 1-wire communication protocol uses the length of the pulses (i.e., pulse width), rather than the number of pulses, to distinguish between the different modes of communication (binary encoded command mode and DC current setting mode commands. Within each mode of communication the pulses are interpreted differently. Because the same 1-wire interface is used for transmitting both programming commands and current setting commands for the LED driver, the same 1-wire interface may be used by the host controller and the LED driver for both DC current programming and current adjustment without an additional wire or an additional pin on the host controller IC and the LED driver IC.

In some embodiments, a communication system includes a host device and a driver device coupled to the host device via a 1-wire interface. Each of the host device and the driver device include 1-wire interface controllers. The controllers communicate with each other using a 1-wire communication protocol. Encoded signals transmitted from the host device via the 1-wire interface are decoded by the driver 1-wire interface controller. The PWM formatted signals are interpreted as binary encoded commands in one mode and as analog encoded command mode signals in another mode.

In some embodiments, a communication system includes a host controller, an LED driver device coupled to the host controller via a 1-wire interface, and a plurality of LEDs coupled to the LED driver. The host controller includes a first 1-wire interface controller, and the LED driver includes a second 1-wire interface controller. The 1-wire interface controllers communicate with each other using a 1-wire communication protocol. Binary encoded commands and analog encoded commands are transmitted from the host controller to the LED driver via the 1-wire interface, and are then appropriately decoded by the second 1-wire interface controller. The binary encoded commands each include a preamble pulse, at least one command pulse and a post-amble pulse. Each binary encoded command begins with the preamble pulse and ends with the post-amble pulse. After the post-amble pulse, signals from the host are interpreted as analog encoded commands where the information transmitted is contained in the width of pulses in the PWM signals.

In other embodiments particularly suited for high power applications, the 1-wire communication system includes a host having an interface controller coupled to a driver circuit by the 1-wire interface. Information is transmitted from the host to the driver circuit by the 1-wire interface for decoding by the driver circuit 1-wire interface controller. The 1-wire interface signals are interpreted as being in different modes, typically a binary encoded command signal mode and an analog encoded command mode. The signals sent by the host are in PWM format. The protocol enables the mode in which the host is operating to be known to the driver circuit, thereby enabling the signals to be appropriately interpreted. The driver circuit interprets the PWM signals during a first mode as binary encoded command signals and interprets the PWM signals during a second mode as analog encoded command signals. The binary encoded command signal mode begins with a preamble pulse, then includes at least one command pulse, and is followed by a post-amble pulse. Signals received after the post-amble pulse are interpreted as conveying information in the analog encoded command mode. In one embodiment the host transmits each pulse in the PWM format as a pair of signals, a first one of the pair of signals being a first pulse of a first polarity, and a second one of the pair of signals being a second pulse of opposite polarity. The driver circuit interprets the first pulse as representing a rising edge of a PWM format signal and interprets the second pulse as representing a falling edge of a PWM format signal.

BRIEF DESCRIPTION OF THE DRAWINGS

The teachings of the embodiments of the present invention can be readily understood by considering the following detailed description in conjunction with the accompanying drawings.

DETAILED DESCRIPTION OF THE PREFERRED EMBODIMENTS

Reference will now be made in detail to several embodiments of the present invention, examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will recognize from the following description that alternative embodiments of the structures and methods illustrated herein may be employed without departing from the principles of the invention described herein.

Figure 1:
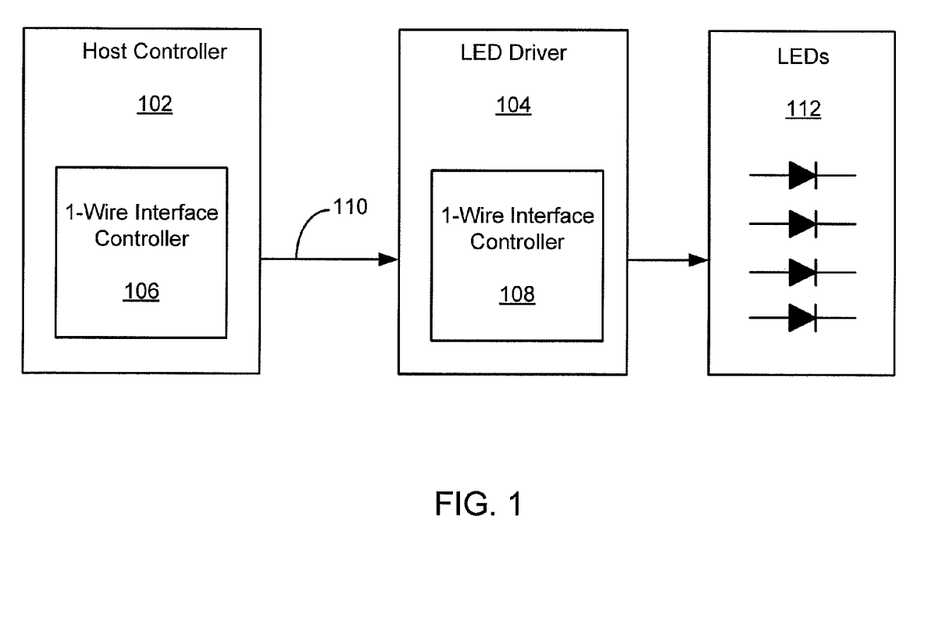
FIG. 1 illustrates an LED driver system controlled by a host controller using a 1-wire communication protocol and interface circuitry.

According to various embodiments of the present invention, a 1-wire communication protocol and interface circuitry for communication between a host device (e.g., a host controller) and a driver device (e.g., an LED driver) is disclosed. FIG. 1 illustrates an LED driver system controlled by a host controller 102 using a 1-wire communication protocol and interface circuitry to communicate with an LED driver 104 to drive a plurality of LEDs 112. The host controller 102 includes a 1-wire interface controller 106, and the LED driver 104 also includes a 1-wire interface controller 108. Both 1-wire interface controllers 106, 108 communicate with each other on a single wire interface 110, using a 1-wire communication protocol, as will be explained in more detail below with reference to FIG. 2A and FIG. 2B.

The 1-wire communication protocol is configured such that control signals transmitted in a pulse width modulation format are interpreted in one of two modes—a first mode as binary encoded command mode signals and a second mode as analog encoded command mode signals. More generally, in the first mode the PWM formatted signals are interpreted as conveying binary information, e.g. "1" and "0", e.g. for programming an LED driver circuit. In contrast in the second mode the PWM formatted signals are interpreted as conveying analog information, e.g. for setting DC current to be provided to the LEDs coupled to the driver circuit. In this second mode the pulse width represents a value such as a percentage of the programmed peak LED current, e.g. 73%. The 1-wire communication protocol uses the pulse width of the PWM formatted pulses, rather than the number of pulses, to distinguish between the two different modes of communication, for example to distinguish between specific programming commands or specific LED drive current. Because the same 1-wire interface 110 is used for transmitting both types of control information to the LED driver 104, the same 1-wire interface 110 may be used for both programming and current adjustment without need for an additional wire, and therefore without need for additional pins on the host controller IC and the LED driver IC.

Figure 2A:
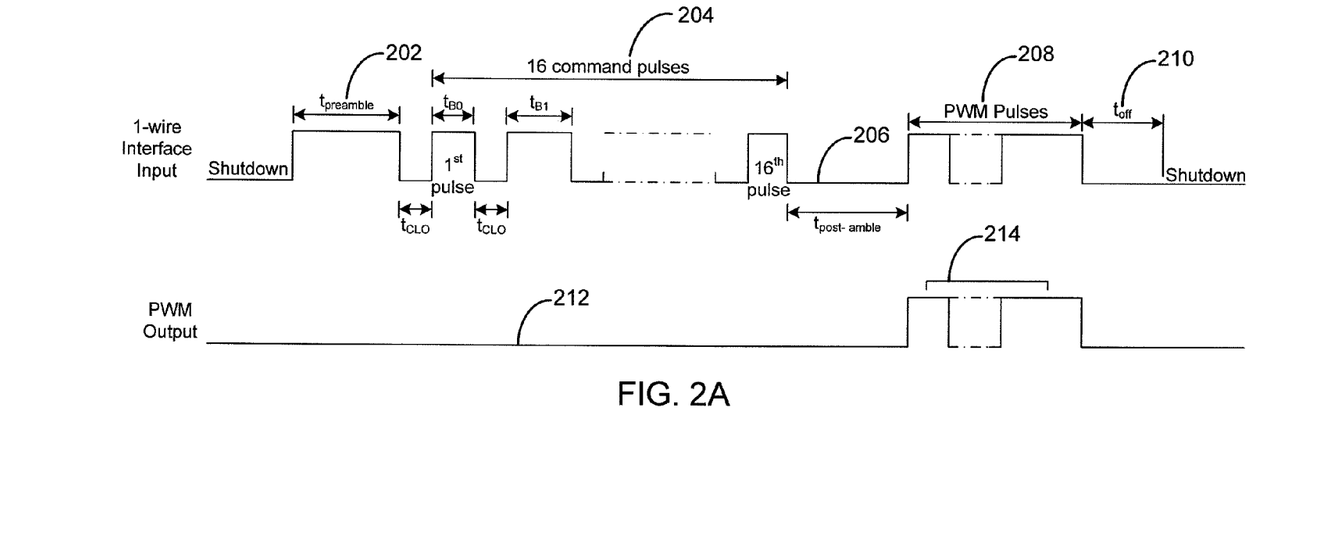
FIG. 2A and FIG. 2B are timing diagrams illustrating the 1-wire communication protocol.
Figure 2B:
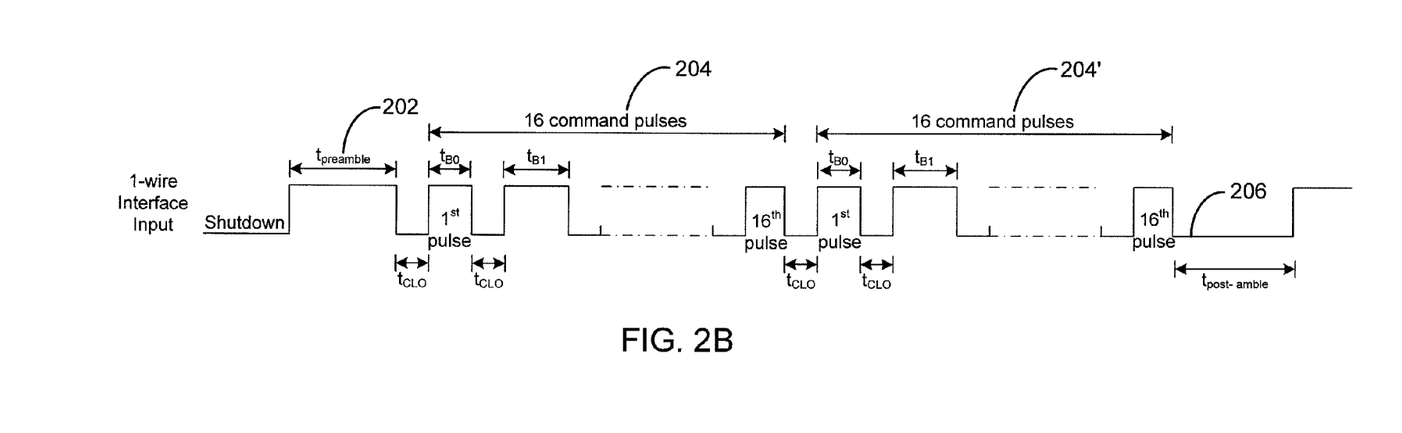
Figure 3:
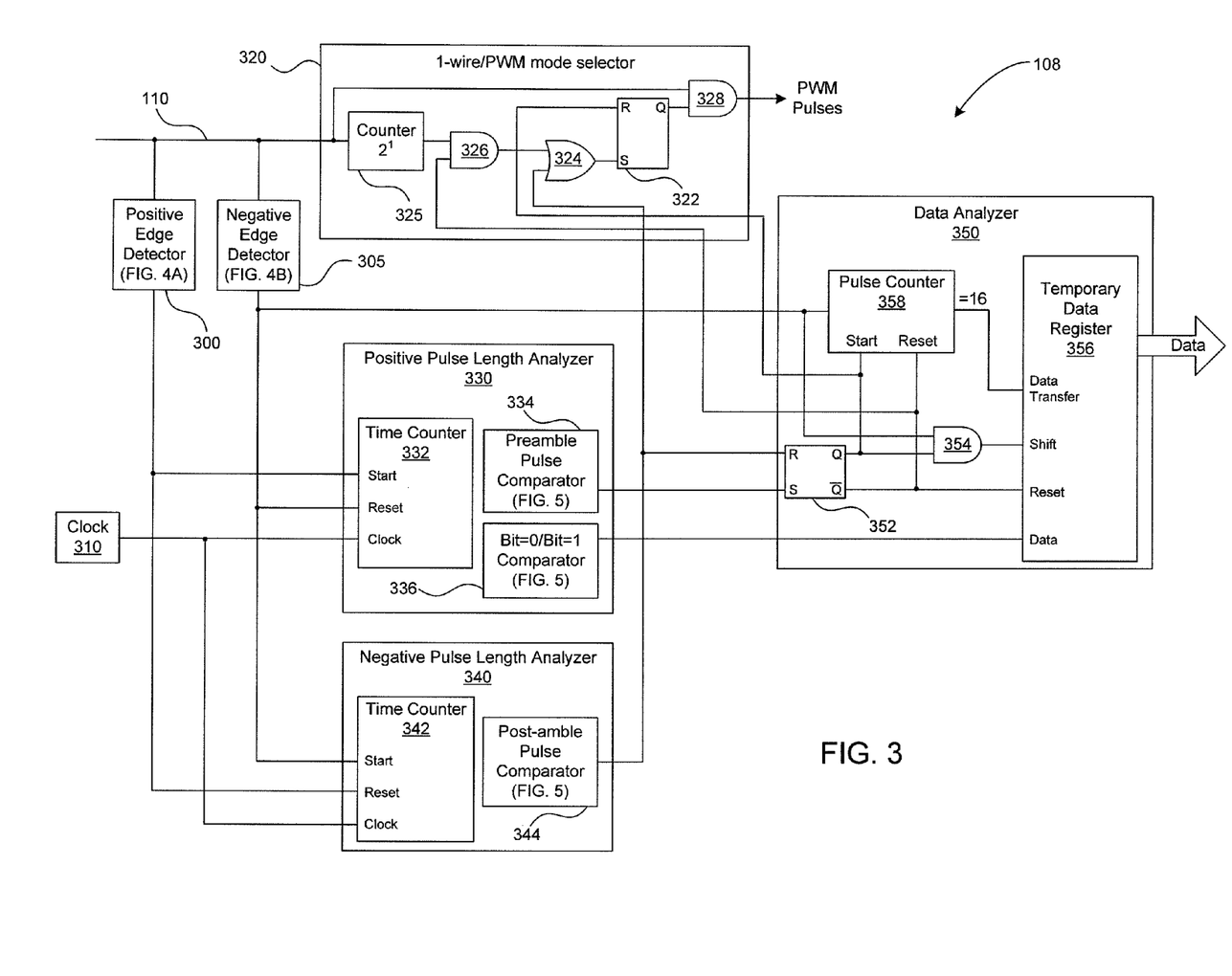
FIG. 3 illustrates the 1-wire communication interface circuitry in the LED driver.

FIG. 2A and FIG. 2B are timing diagrams illustrating the 1-wire communication protocol according to one embodiment of the present invention. Referring to FIG. 2A, in a first mode the 1-wire communication protocol uses pulse width format control signals to communicate binary zero/one for programming the driver circuit. After programming the driver circuit, the control signals in PWM format can be used for adjusting the average current of the LED driver 104 in a second mode. The control signal pulse patterns shown in FIGS. 2A and 2B can be generated by appropriate digital logic circuitry in the 1-wire interface controller 106 of the host controller 102, and then decoded by the 1-wire interface controller 108 in the LED driver 104. Preferred decoding circuitry for the LED driver is shown in FIG. 3.

Each 1-wire interface command starts with a preamble pulse 202. The decoder considers a pulse to be a preamble pulse if the pulse is at a logic level HIGH for at least as long as a predetermined preamble pulse length ($t_{preamble}$).

Once the preamble pulse 202 is recognized, subsequent PWM formatted pulses are interpreted as binary encoded command mode signals 204, for example, as commands for programming the peak DC current to be provided by the LED driver 104. Any number of commands 204 may follow the preamble pulse 202. Each command 204 contains N pulses. The example shown in FIG. 2A uses sixteen pulse commands (N=16). Each of the sixteen pulses is recognized as a binary zero or binary one, depending upon whether the pulse width is $t_{B0}$ or $t_{B1}$, respectively. There is a low period ($t_{CLO}$) between each pair of command pulses 204 to enable distinguishing between them. The sixteen command pulses encode up to $2^{16}$ commands for transmission of binary information from the host controller 102 to the LED driver 104.

As explained above, the 1-wire communication protocol may send an unlimited number of command pulses 204 in command pulse transmission mode before entering the PWM pulse transmission mode. For example, FIG. 2B shows a multi-command pulse sequence, where each subsequent sixteen-pulse command 204' is sent immediately after a previous sixteen-pulse command 204 without interruption. The time difference between the sixteenth pulse of the first sixteen-pulse command 204 and the first pulse of the second sixteen-pulse command 204' is equal to the low period ($t_{CLO}$). The first command 204 starts with the preamble pulse 202 and the last command (e.g., the second command 204') ends with the post-amble pulse 206 to enter the PWM pulse transmission mode.

The end of the binary encoded command mode is designated by a post-amble pulse 206. A pulse is interpreted as a post-amble pulse if the pulse is at logic level LOW for at least as long as a predetermined post-amble pulse period ($t_{post-amble}$). Once the post-amble pulse 206 is recognized, the decoder considers the 1-wire communication protocol to transition to the second mode, that is, to interpret subsequent control signals as analog encoded command mode signals. In this mode subsequent pulses 208 are recognized as DC current setting mode pulses where the width of the PWM pulses 208 is interpreted as, e.g. an analog value for LED drive current to be provided by the LED driver 104.

Once the last analog encoded command mode signal is received, the host sends a shutdown pulse. The shutdown pulse 210 is distinguished as a pulse remaining at a logic level LOW for longer than a predetermined shutdown period ($t_{off}$). The circuitry remains in shutdown mode until the next preamble pulse 202 is recognized. At this point the circuit operates just as described above.

FIG. 3 is a block diagram illustrating the 1-wire communication interface circuitry of the 1-wire interface controller 108 in the LED driver 104, according to one embodiment of the present invention. The 1-wire communication interface circuitry is used to decode the 1-wire communication protocol PWM formatted pulses generated by the host controller.

The 1-wire communication interface circuitry includes a positive pulse edge detector 300, a negative pulse edge detector 305, a clock 310, a 1-wire/PWM mode selector 320, a positive pulse length analyzer 330, a negative pulse length analyzer 340, and a data analyzer 350. The positive pulse edge detector 300 and the negative pulse edge detector 305 detect positive and negative edges, respectively, of incoming pulses on the 1-wire interface 110, and trigger the operation of the positive pulse length analyzer 330 and the negative pulse length analyzer 340, respectively. The positive pulse length analyzer 330 includes a time counter 332, a preamble pulse comparator 334 and a bit=0/bit=1 comparator 336. The negative pulse length analyzer 340 includes a time counter 342 and a post-ample pulse comparator 344. The clock 310 provides a clock signal to the time counter 332 of the positive pulse length analyzer 330 and the time counter 342 of the negative pulse length analyzer 340. The 1-wire/PWM mode selector includes an R-S flip-flop 322, an OR gate 324, a counter 325 and two AND gates 326, 328. The data analyzer 350 includes an R-S flip-flop 352, an AND gate 354, a temporary data register 356 and a pulse counter 358.

Referring to FIG. 3 together with FIG. 2A, after power-up, the 1-wire communication interface circuitry waits for a first incoming positive pulse to arrive through the 1-wire interface 110. In accordance with the 1-wire communication protocol, if the first pulse is a preamble pulse 202, data transfer begins in the command pulse transmission mode. The positive edge of the preamble pulse 202 is detected by the positive edge detector 300, and the positive edge detector 300 starts the time counter 332 of the positive pulse length analyzer 330. The time counter 332 stops and is reset by a negative pulse edge detected by the negative pulse edge detector 305. Thus, the time counter 332 determines a pulse width between the positive and negative edges of the first pulse between start and stop/reset conditions, respectively, in terms of the number of pulses of the clock signal provided by the clock 310.

The determined pulse width is compared with a predetermined preamble pulse length ($t_{preamble}$) in the preamble pulse comparator 334. If the determined pulse width is equal to the predetermined preamble pulse length ($t_{preamble}$), the first pulse is recognized as a preamble pulse 202, and the preamble pulse comparator 334 generates a pulse that sets the R-S flip-flop 352 of the data analyzer 350. As a result, the R-S flip-flop 352 outputs a logic level HIGH at a non-inverting output Q to one input of the AND gate 354 and a logic level LOW at an inverting output ~Q to a "reset" input of the temporary data register 356.

Once the preamble pulse 202 is recognized, subsequent incoming pulses through the 1-wire interface 110 are recognized as binary data pulses corresponding to one of the sixteen command pulses. They are analyzed in the same way as the preamble pulse, i.e., positive and negative edges are detected by the positive edge detector 300 and negative edge detector 305, respectively, with the pulse length between the positive and negative edges being determined by the time counter 332. The determined pulse length is compared with a predetermined pulse length ($t_{B0}$ or $t_{B1}$) corresponding to bit=0 or bit=1 in the Bit=0/Bit=1 comparator 336, to determine whether the pulse length corresponds to bit=0 or bit=1. If the pulse width corresponds to $t_{B0}$, the data pulse is interpreted as bit=0. If the pulse width corresponds to $t_{B1}$, the data pulse is detected as bit=1. The detected data is output from the comparator 336 and is provided to a data input of the temporary data register 356.

The temporary data register 356 is a shift register that shifts by one bit at every negative pulse edge detected by the negative pulse edge detector 305. As shown in FIG. 3, the "shift" input to the temporary data register 356 is provided by the output of the AND gate 354. A first input to the AND gate 354 is the output of the negative edge detector 305, and a second input to the AND gate 350 is the non-inverting (Q) output of the R-S flip flop 352. Thus, the "shift" input to the temporary data register 356 is at logic level HIGH when a negative pulse edge is detected on the 1-wire interface 110 after a preamble pulse is detected by the preamble pulse comparator 334. Thus, as the binary data pulses (i.e., sixteen commands) are received through the 1-wire interface 110, the data is recognized and input to the temporary data register 356 by the bit=0/bit=1 comparator 336. The previously input data is shifted by one bit at the negative edge of the data pulse so that subsequently recognized data can be input to the temporary data register 356. In this manner, the serially received data corresponding to the sixteen command pulses can be stored in the temporary data register 356 and shifted at the negative edge of each command pulse for simultaneous parallel output.

The pulse counter 358 counts the number of pulses received via the 1-wire interface 110, as indicated by the negative edges of the pulses detected by the negative pulse edge detector 305. As explained above, each command 204 is represented by sixteen consecutive pulses following the preamble pulse 202. When the number of command pulses 204 counted by the pulse counter 358 equals sixteen, the pulse counter 358 generates and provides a pulse to the "data transfer" input of the temporary data register 356 to transfer the stored command data from the temporary data register 356 into a permanent data register (not shown) in the LED driver 104. The transferred command data is used, for example, to set the DC current to be provided by the LED driver 104 to the LEDs 112.

If the total number of command pulses 204 is less than sixteen, or if data transfer is interrupted, or if the time between two consecutive data pulses is longer than the end command mode negative pulse (i.e., the post-amble pulse 206), the temporary data register 356 is reset, and the 1-wire interface 110 transitions to the second mode, e.g. analog encoded command mode signals, which in the preferred embodiment is the DC current setting mode. In this mode, each incoming pulse to the 1-wire interface 110 is interpreted as a DC current setting mode signal rather than a binary encoded command mode signal.

The negative pulse length analyzer 340 is used to detect the transition to this DC current setting mode. A negative pulse edge of the sixteenth (i.e., last) command pulse is detected by the negative pulse edge detector 305. The length of the logic level LOW following the negative pulse edge is determined by the time counter 342. Specifically, the negative edge detector 305 starts the time counter 342 upon detecting the negative pulse edge of the sixteenth command pulse. The positive edge of the first PWM pulse 208 is detected by the positive edge detector 300, which resets (i.e., stops) the time counter 342. Thus, the length of the logic level LOW between the negative edge of the last command pulse 204 and the positive edge of the first PWM format pulse 208 is determined by the time counter 342 in terms of the number of pulses from the clock 310 written into the time counter 342 between start and stop/reset events.

The determined length of the logic level LOW is compared by the post-amble pulse comparator 344 with a predetermined post-amble pulse length ($t_{post-amble}$). If the determined length of the logic level LOW is equal to the predetermined post-amble pulse length $t_{post-amble}$, the post-amble pulse comparator 344 generates a pulse that resets the R-S flip-flop 352 of the data analyzer 350 and sets the R-S flip-flop 322 of the 1-wire/PWM mode selector 320 via the OR gate 324. As a result, the R-S flip-flop 352 outputs a logic level LOW at the non-inverting (Q) output and a logic level HIGH at the inverting (~Q) output. Thus, the AND gate 354 of the data analyzer 350 outputs a logic level LOW to the "shift" input of the temporary data register 356, thereby preventing a shifting operation in the temporary data register 356 at the negative pulse edges of subsequent pulses. The logic level HIGH at the inverting (~Q) output of the R-S flip flop 352 resets data in the temporary data register 356, resets the pulse counter 358 thereby preventing subsequent incoming pulses from being written as data in the temporary data register 356, and transitions the 1-wire interface 110 into analog encoded command mode.

If the first incoming pulse on the 1-wire interface 110 after a power-up pulse is not a preamble pulse 202, the first incoming pulse is ignored and the next pulse is recognized as a PWM formatted pulse 208 in the analog encoded command mode. The 1-wire/PWM mode selector 320 determines this condition and allows the second and subsequent pulses to be recognized as PWM formatted pulses to be interpreted as analog encoded command mode signals.

Specifically, the counter 325 of the 1-wire/PWM mode selector 320 counts the number of incoming pulses up to two pulses, and sets output to a logic level HIGH at the second incoming pulse, which is provided as one input of the AND gate 326. The other input of the AND gate 326 is provided by the inverting (~Q) output of the R-S flip-flop 352 of the data analyzer 350. If the first pulse is not a preamble pulse, the inverting (~Q) output of the R-S flip-flop 352 will be at a logic level HIGH, since the preamble pulse comparator 334 would not have set the R-S flip flop 352. Thus, when the counter 325 outputs a logic level HIGH at the second pulse, the AND gate 326 outputs a logic level HIGH to one of the inputs of the OR gate 324, thereby setting the R-S flip-flop 322 of the 1-wire/PWM mode selector 320. Thus, the non-inverting (Q) output of the R-S flip-flop 322 becomes a logic level HIGH, which is provided as one input to the AND gate 328 of the 1-wire/PWM mode selector 320. The other input to the AND gate 328 is from the 1-wire interface 110. Thus, all subsequent incoming pulses pass through the AND gate 328 and are recognized as pulses for setting the average LED drive current to be provided to the LEDs 112 by the LED driver 104.

If a preamble pulse 202 is detected, as explained above, the preamble pulse comparator 334 sets the R-S flip-flop 352 of the data analyzer 350, which in turn resets the R-S flip-flop 322 of the 1-wire/PWM mode selector 320, to prevent subsequent pulses from being recognized as DC current setting mode pulses. The OR gate 324 is used to set the R-S flip-flop 322 either via the counter 325 (if no preamble pulse is detected) or via the post-amble pulse comparator 344 (if the 1-wire command transmission mode ends or is interrupted). The AND gate 326 prevents the R-S flip-flop 322 from being set by the counter 325 in case a preamble pulse 202 is detected. Specifically, the non-inverting (~Q) output of the R-S flip-flop 352 of the data analyzer 350 is at a logic level LOW when the preamble pulse 202 is detected. Thus, the output of the AND gate 326 is also at a logic level LOW, which is provided as one input to the OR gate 324. The other input to the OR gate 324 is also at a logic level LOW, since the post-amble pulse comparator 344 outputs a logic level LOW prior to detection of the post-amble pulse 206. Thus, output of the OR gate 324 is at a logic level LOW and the non-inverting (Q) output of the R-S flip-flop 322 is also at a logic level LOW, thereby preventing the 1-wire interface 110 from entering the analog encoded command mode.

Finally, the frequency (f) of the clock 310 determines the resolution of pulse length measurement $s=1/f$. The capacities of the time counters 332, 342 are equal or greater than $t_{preamble} \times f$ and $t_{post-amble} \times f$, respectively.

Figure 4A:
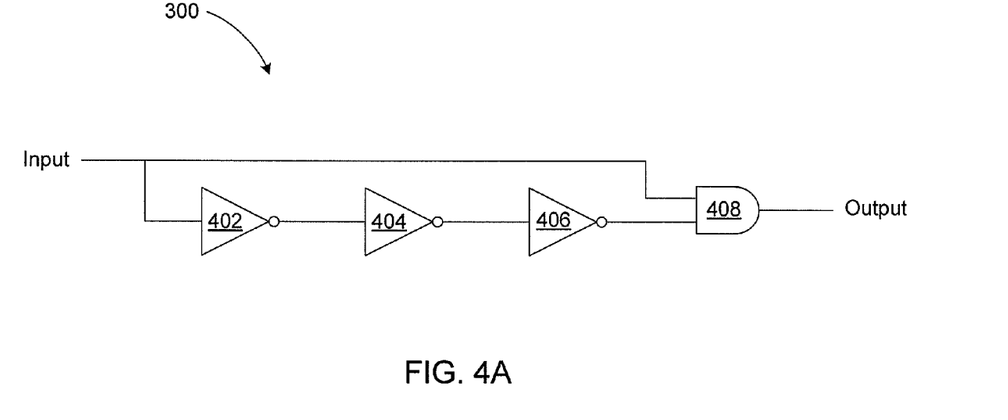
FIG. 4A illustrates a positive edge detector.

FIG. 4A illustrates the positive pulse edge detector 300, according to one embodiment of the present invention. The positive pulse edge detector 300 includes three invertors 402, 404, 406 followed by a two-input AND gate 408. The three invertors 402, 404, 406 are connected in series to add a propagation delay to an inverted input to the positive pulse edge detector 300. Both the input and the inverted-delayed input (via invertors 402, 404, 406) are provided as the two inputs to the AND gate 408. Thus, the output of the AND gate 408 is at a logic level HIGH if the input signal to the positive pulse edge detector 300 transitions from a logic level LOW to a logic level HIGH, until the inverted-delayed input transitions from a logic level HIGH to a logic level LOW. The pulse length of the output of the AND gate 408 is equal to the propagation delay in the three invertors 402, 404, 406.

Figure 4B:
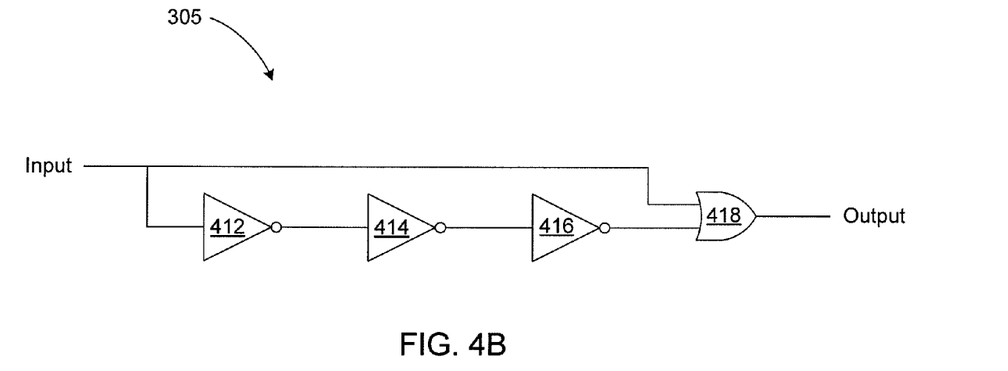
FIG. 4B illustrates a negative edge detector.

FIG. 4B illustrates the negative pulse edge detector 305, according to one embodiment of the present invention. The negative pulse edge detector 305 includes three invertors 412, 414, 416 followed by a two-input NOR gate 418. The three invertors 412, 414, 416 are connected in series to add a propagation delay to an inverted input to the negative pulse edge detector 305. Both the input and the inverted-delayed input (via invertors 412, 414, 416) are provided as the two inputs to the NOR gate 418. The inverted output of the NOR gate 418 is at a logic level HIGH if the input signal to the negative pulse edge detector 305 transitions from a logic level HIGH to a logic level LOW, until the inverted-delayed input transitions from a logic level LOW to a logic level HIGH. When the inverted-delayed input transitions from a logic level LOW to a logic level HIGH, the NOR gate 418 outputs a logic level LOW. Thus, the pulse length of the inverted output of the NOR gate 418 is equal to the propagation delay in the three invertors 412, 414, 416.

Although FIGS. 4A and 4B illustrate typical circuitry that can be used as the positive and negative pulse edge detectors 300, 305, other circuitry can be used to perform the same function. The present invention is not limited to the specific implementation of the positive and negative pulse edge detectors 300, 305 as shown in FIGS. 4A and 4B.

Figure 5:
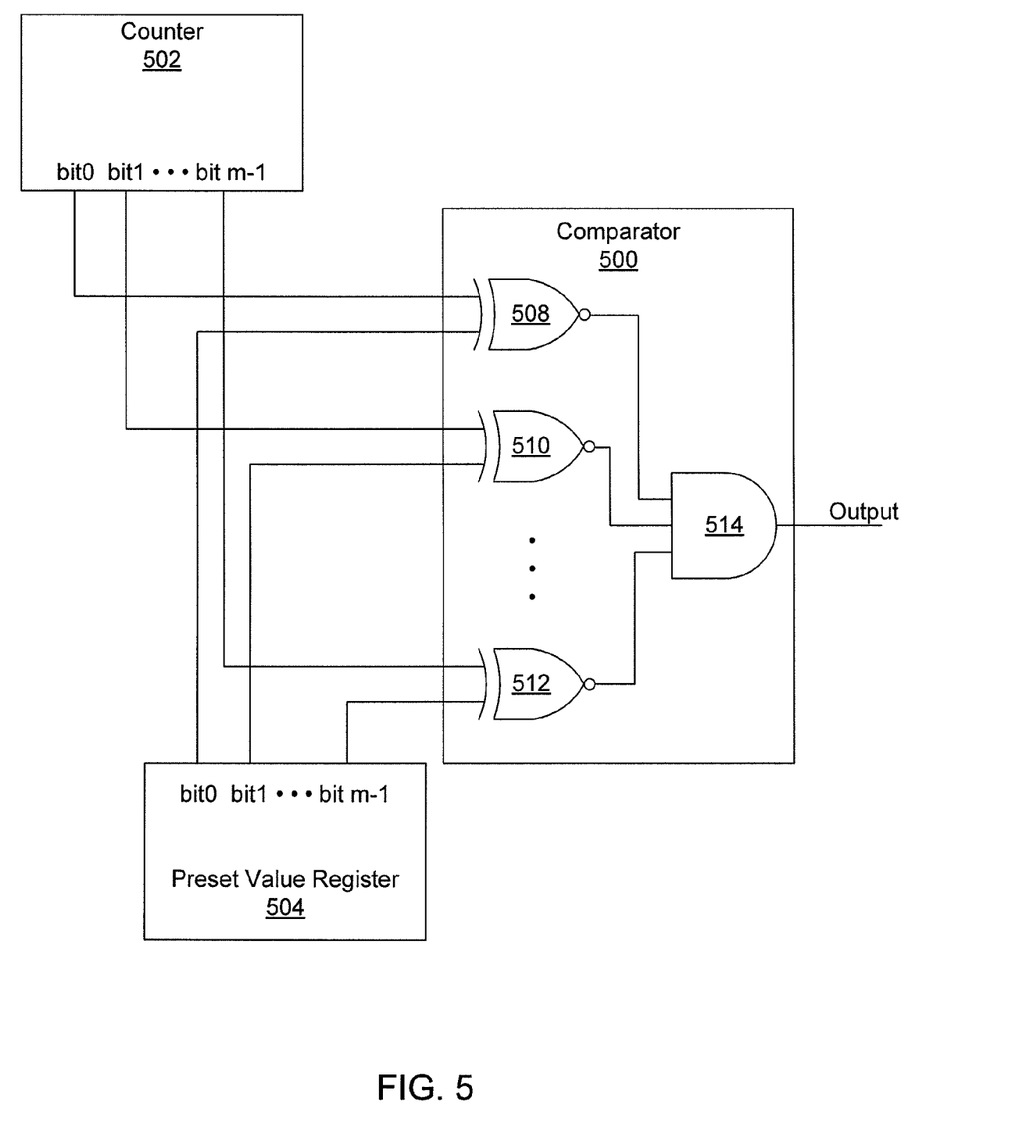
FIG. 5 illustrates a pulse comparator.

FIG. 5 illustrates a pulse comparator 500, according to one embodiment of the present invention. The pulse comparator 500 can be used, for example, as the preamble pulse comparator 334, the post-amble pulse comparator 344 or the Bit=0/Bit=1 comparator 336. The comparator 500 includes m two-input XNOR gates 508, 510, 512 and one m-input AND gate 514, where m corresponds to the number of bits representing a binary value of the expected pulse length ($t_{preamble}$, $t_{post-amble}$ or $t_{CLO}$) multiplied by the frequency (f) of the clock 310. One of the inputs to each XNOR gate 508, 510, 512 is connected to a corresponding bit (e.g., bit 0, bit 1, ..., bit m−1) of a counter 502, while the other input to each XNOR gate 508, 510, 512 is connected to a corresponding bit (bit 0, bit 1, ..., bit m−1) of a preset value register 504 which stores an expected (i.e., preset) value. The counter 502 may be the time counter 322 or the time counter 342, depending on whether the comparator 500 is the preamble pulse comparator 334, the Bit=0/Bit=1 comparator 336 or the post-amble pulse comparator 344. The preset value may be a predetermined value corresponding to the expected pulse length ($t_{preamble}$, $t_{post-amble}$, $t_{B0}$ or $t_{B1}$) multiplied by the frequency (f) of the clock 310, and may be either hardwired or stored in any kind of memory. With this arrangement, each of the XNOR gates 508, 510, 512 outputs a logic level HIGH when each of the corresponding bits in the counter 502 and the preset value of the register 504 is equal to each other. When all of the corresponding bits in the counter 502 and the preset values in the register 504 are equal to each other, the AND gate 514 outputs a logic level HIGH as the output of the comparator 500.

We next describe an alternate embodiment of our invention particularly suited for high voltage applications. The preceding embodiments are well suited for conventional 3 to 5 volt applications, but have a disadvantage at high voltages, e.g. 4000 volts. At such high potentials, undesirably large amounts of DC power are consumed sending the PWM formatted signals. In addition, the high potentials require that the driver circuit be carefully protected, and isolated.

Figure 6:
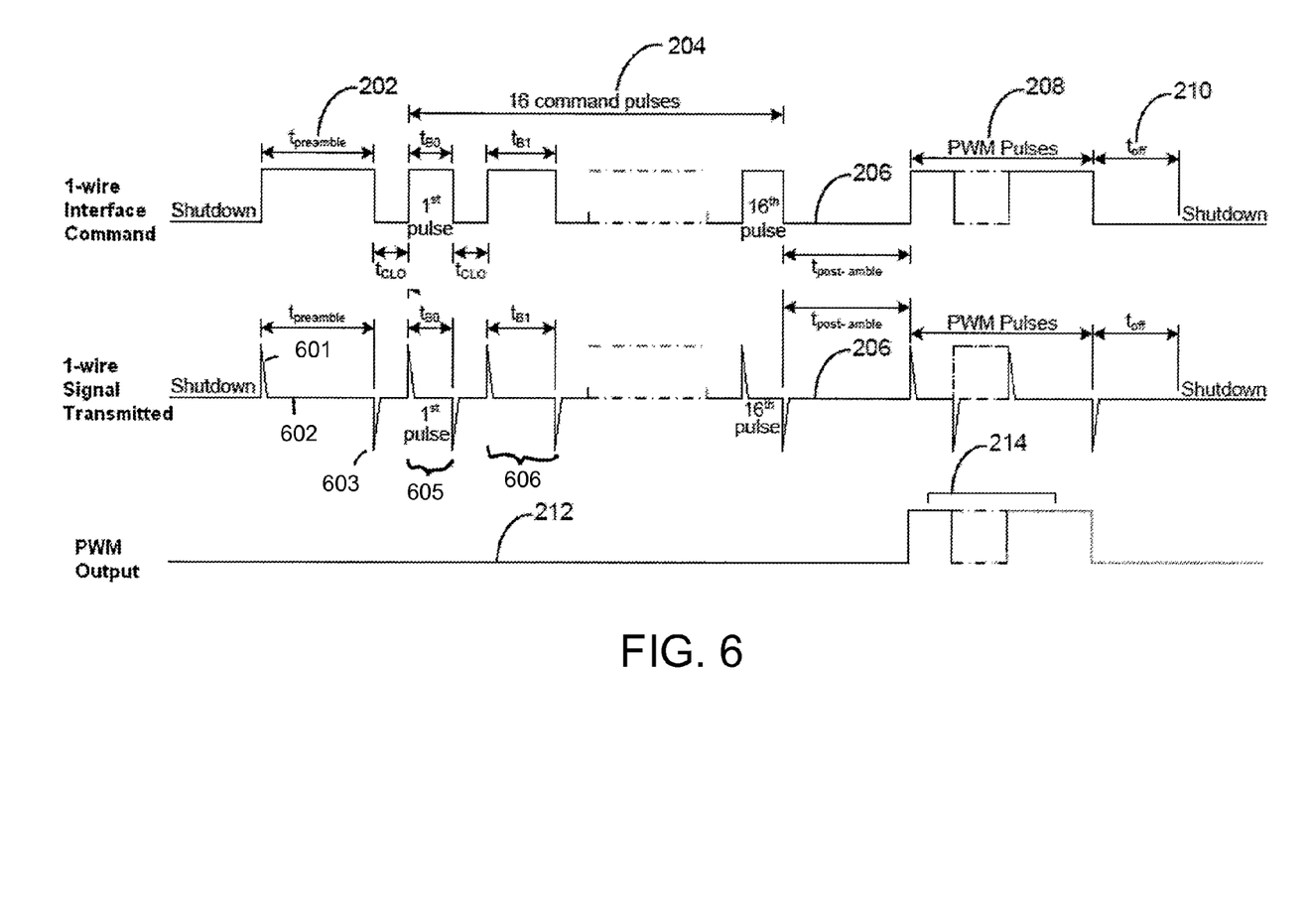
FIG. 6 illustrates timing diagrams for a 1-wire communication protocol using short pulses to represent rising and falling edges of a PWM format signal.

FIG. 6 illustrates the principles of operation and 1-wire protocol for our implementation for high voltage applications. The upper and lower timing diagrams in FIG. 6 correspond to those same diagrams of FIG. 2A. Referring to the upper diagram in FIG. 6, the 1-wire communication protocol uses pulse width formatted signals to determine binary zero/one for programming the DC current. After programming the DC current as peak current, the DC current setting mode is used for adjusting the PWM average current of the LED driver 104.

Each 1-wire interface command starts with a preamble pulse 202. Just as described above, a pulse is considered a preamble pulse if the pulse is at a logic level HIGH for at least as long as a predetermined preamble pulse period ($t_{preamble}$).

Once the preamble pulse 202 is recognized, subsequent pulses are interpreted as binary encoded command mode pulses 204, for example, as commands for programming the DC current to be provided by the LED driver 104. As also explained above, any number of commands 204 may follow the preamble pulse 202, and each command 204 contains N pulses. The example shown in FIG. 6 uses sixteen pulse commands (N=16). Each of the sixteen pulses is recognized as a binary zero or binary one, depending upon whether the pulse width is $t_{B0}$ or $t_{B1}$, respectively. There is a low period ($t_{CLO}$) between each of the command pulses 204 to distinguish among the command pulses 204.

Also just as described above, the binary encoded command mode ends with a post-amble pulse 206. Once the post-amble pulse 206 is recognized, the 1-wire communication protocol transitions into analog encoded command mode, until the next preamble pulse 202 is recognized. Thus, pulses 208 after the post-amble pulse are interpreted as analog encoded command mode signals. In this mode, the width of the PWM pulses 208 is interpreted as an analog value, e.g. average LED drive current to be provided by the LED driver. This mode ends with a shutdown pulse 210 that is at logic level LOW for longer than a predetermined shutdown period ($t_{off}$). Once the shutdown pulse 210 is recognized, the 1-wire communication protocol enters shutdown mode.

As shown by FIG. 6 in the middle diagram, for high voltage or other applications, however, rather than send the pulses themselves, the host, using well known circuitry, converts the relatively long PWM formatted pulses into pairs of much shorter pulses. After the conversion, a short positive pulse represents the rising edge of one of the longer PWM format pulses and a short negative pulse represents the falling edge of one of the longer PWM format pulses. This convention is applicable to all of the PWM formatted pulses regardless of whether the signals are being interpreted as binary encoded command mode signals or as analog encoded command mode signals.

Thus, for example, the preamble pulse 202, instead of being represented by a pulse of time duration $t_{preamble}$ is instead represented by a short positive pulse 601, a quiet period 602, and then a short negative pulse 603. Similarly, the 16 command pulses 204 are represented by a corresponding series of pairs 605, 606 of positive going and negative going pulses. In each pair 605, 606 an initial positive pulse represents the leading (rising) edge of the corresponding PWM pulse, while a following negative pulse represents the trailing (falling) edge of the corresponding PWM pulse. The lower diagram in FIG. 6 illustrates the PWM output, and corresponds to the lower diagram in FIG. 2A.

Figure 7:
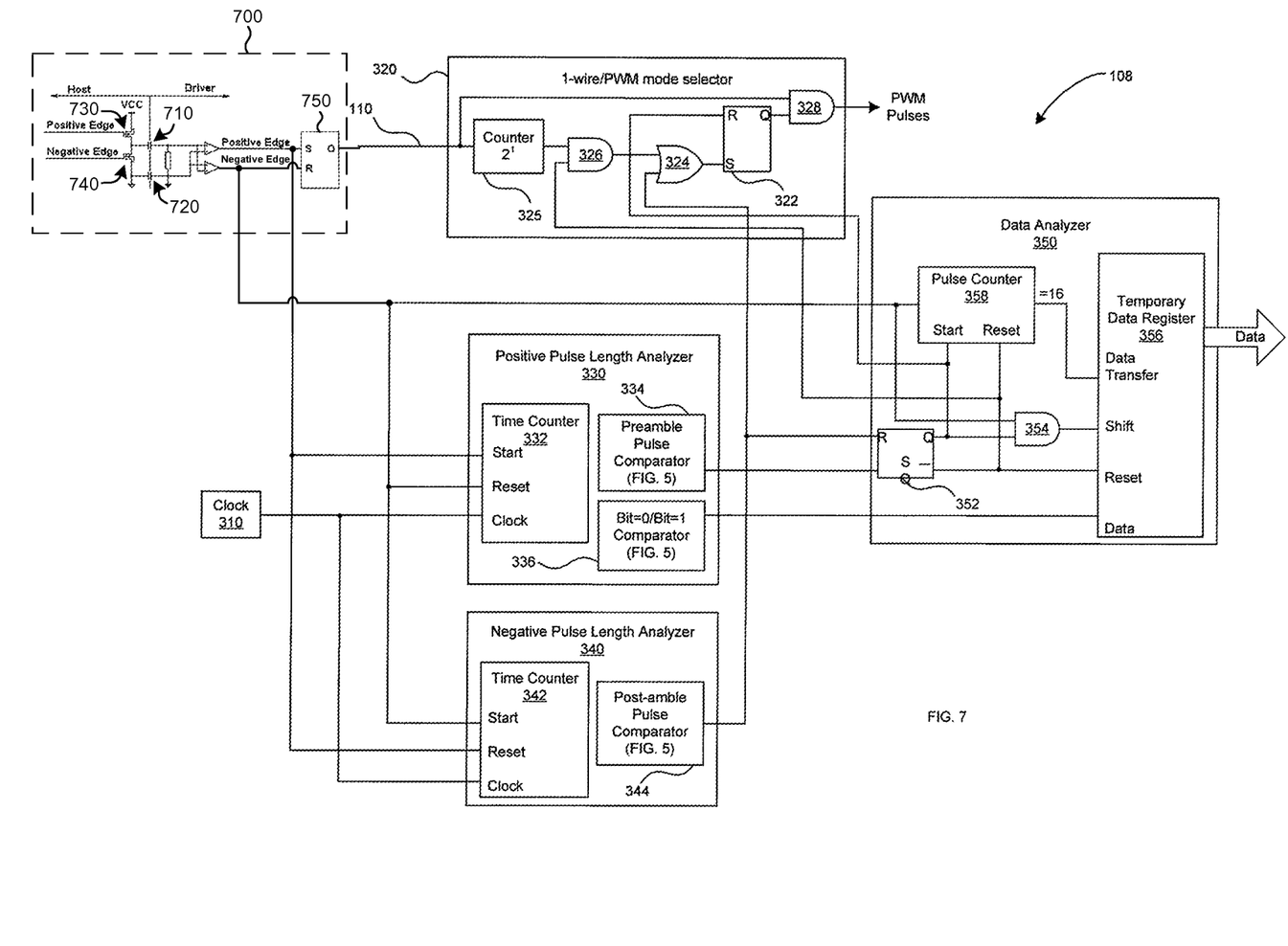
FIG. 7 illustrates the 1-wire communication interface circuitry in the LED driver for the protocol of FIG. 6.

FIG. 7 is a block diagram illustrating a preferred embodiment of the circuit used to interpret the short positive and short negative pulses described above. In this implementation each command, preamble, post-amble, or other PWM formatted pulse is transmitted through one wire as a sequence of short positive and negative current pulses. The PWM formatted signal pulse length is determined as the time between the rising and falling edges of the transmitted pairs of short pulses.

FIG. 7 is a block diagram illustrating the 1-wire communication interface circuitry of the 1-wire interface controller 108 in the LED driver 104, for the embodiment described immediately above, and illustrated in the middle diagram of FIG. 6, in which short positive-going and negative-going pulses are used. The 1-wire communication interface circuitry in FIG. 7 is used to decode the control signals generated by the host controller 102 using the 1-wire communication protocol illustrated in FIG. 6.

A comparison of FIG. 3 with FIG. 7 will reveal that the same circuitry is used with the exception of modification to components and connections associated with the changed circuitry 700 in the upper left corner of the figure. Thus in the explanation below, only the changed circuitry 700 is described. This circuitry provides signals to the PWM mode selector 320, the positive pulse length analyzer 330, the negative pulse length analyzer 340, and the data analyzer 350. Because the signals from the host are already in the form of short positive and negative pulses, the positive pulse edge detector 300 and negative pulse edge detector 305 illustrated in FIG. 3 are no longer necessary.

In FIG. 7 a capacitor 710 has one terminal connected to receive the host output signal, and the other terminal connected to provide the driver circuit input signal. A second capacitor 720, of at least as large a capacitance, connects the ground terminals of the host and driver. A positive edge provided to transistor 730 places a "1" on the S terminal and a "0" on the R terminal of flip-flop 750, creating the rising edge (a transition from a "0" state to a "1" state) of a pulse from output Q of flip-flop 750. Output Q remains in this state until a negative pulse is provided to transistor 740. This transitions the input R to "0" and the input S to "1" creating a falling edge, thereby ending the pulse provided to circuit 320.

The use of a short pulse generator in the manner described eliminates the need for the positive and negative edge detection circuits 300 and 305 (see FIG. 3). Instead the short positive going pulse is provided directly from S input of flip-flop 750 to the start terminal of time counter 332 and the reset terminal of time counter 342. The short negative going pulse from input R of flip-flop 750 is provided directly to the start terminal of time counter 342 and the reset terminal of time counter 332, as well as to the pulse counter 358. The circuit of FIG. 7 then operates in the same manner as described above with regard to FIG. 3.

Figure 8A:
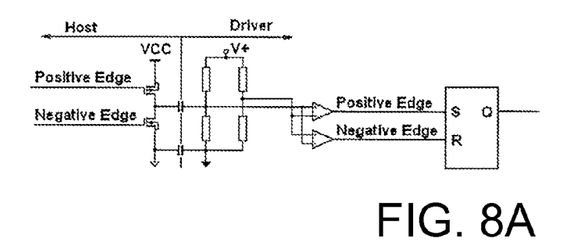
FIGS. 8A to 8E illustrate various implementations for some of the circuitry illustrated in FIG. 7.
Figure 8B:
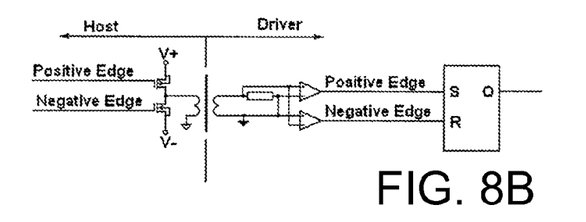
Figure 8C:
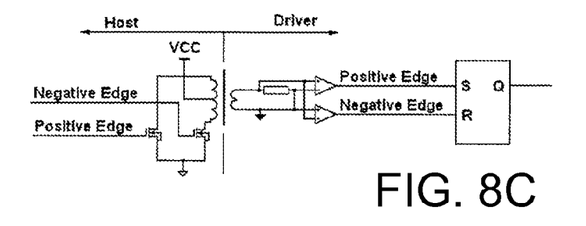
Figure 8D:
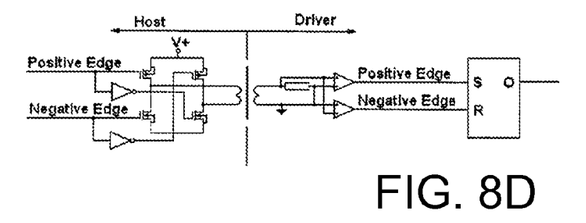
Figure 8E:
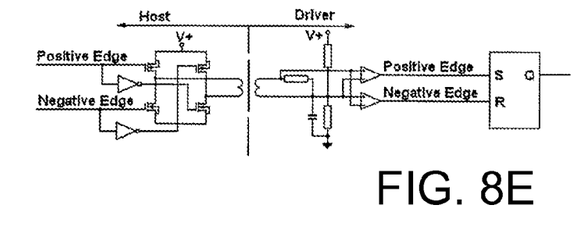

FIGS. 8A to 8E illustrate other embodiments for the circuitry 700 shown in FIG. 7. In each implementation a set-reset flip-flop 750 is used. FIG. 8A is an implementation in which a unipolar power supply is used. FIG. 8B illustrates an implementation which uses a transformer 760 for communication of the pulses to the flip-flop 750. FIG. 8C illustrates another unipolar implementation in which a transformer is used. FIG. 8D illustrates an implementation in which four switches are used to change the polarity of the signal to transformer. FIG. 8E illustrates a further implementation using a transformer.

Upon reading this disclosure, those of skill in the art will appreciate alternative designs for 1-wire communication between a host device and a driver device. For example, although the communication protocol described herein is illustrated as facilitating communication between a host controller and an LED driver as an example of application, the same communication protocol may be used for communication between any host device and a corresponding driver device using a 1-wire communication interface. Thus, while particular embodiments and applications of the invention have been illustrated and described, it is to be understood that the invention is not limited to the precise construction and components disclosed herein. Various modifications, changes and variations will be apparent to those skilled in the art in the arrangement, operation and details of the method and apparatus of the invention disclosed herein without departing from the spirit and scope of the invention.

What is claimed is:

1. A system for communicating with a host using control signals over a 1-wire interface comprising:
    a driver coupled to the host by the 1-wire interface, the driver including a driver controller; and wherein:
        control signals are transmitted from the host to the driver by the 1-wire interface for decoding by the driver controller;
        the control signals include binary encoded command mode signals and analog encoded command mode signals, each of the binary encoded command mode signals and the analog encoded command mode signals being signals in a pulse width modulation (PWM) format;
        the driver controller interprets the control signals during the binary encoded command mode as binary signals, and interprets the control signals during the analog encoded command mode as analog signals; and
        each binary encoded command mode signal includes a preamble pulse, at least one command pulse, and a post-amble pulse, each binary encoded command mode signal beginning with the preamble pulse and ending with the post-amble pulse.

2. The system of claim 1, wherein the control signals received by the driver after the post-amble pulse are interpreted by the driver controller as analog encoded command mode signals.

3. The system of claim 2, wherein following the analog encoded command mode signals, a shutdown signal indicates that all analog encoded command mode signals have been sent.

4. The system of claim 1, wherein the driver controller interprets each control signal as a PWM format signal in which a pair of signals represents a single pulse, a first one of the pair of signals being a first pulse of a first polarity, and a second one of the pair of signals being a second pulse of opposite polarity, the first pulse of the first polarity representing a rising edge of the single pulse and the second pulse of opposite polarity representing a falling edge of the single pulse.

5. The system of claim 4, wherein:
    the first pulse of the first polarity and the second pulse of opposite polarity are at a first and second higher power, respectively; and
    the driver includes an isolation circuit to convert the first pulse of the first polarity and the second pulse of opposite polarity from the first and the second higher power to a third and fourth lower power, respectively before supplying the first pulse of the first polarity and the third lower power and the second pulse of opposite polarity and the fourth lower power to the driver controller.

6. The system of claim 1, wherein the driver controller interprets the binary encoded command mode signals as data for programming the driver and the analog encoded command mode signals as analog information representing values of parameters.

7. The system of claim 6, wherein during the binary encoded command mode the control signals are interpreted as a binary zero or binary one depending upon whether the pulse width is a first, shorter value or a second, longer value.

8. The system of claim 7, wherein during the binary encoded command mode, following each pulse there is a fixed period before a next pulse.

9. The system of claim 8, wherein the driver controller receives each binary encoded command mode signal as a pair of signals, a first one of the pair of signals being a first pulse of a first polarity, and a second one of the pair of signals being a second pulse of opposite polarity, the first pulse representing a rising edge of a control signal and the second pulse representing a falling edge of a control signal.

10. The system of claim 8, wherein the driver controller separates control signals between the binary encoded command mode and the analog encoded command mode based on a width of the post-amble pulse.

11. The system of claim 10, wherein during the analog encoded command mode the driver controller interprets the control signals to adjust current provided by the driver to a load.

12. The system of claim 11, wherein during the binary encoded command mode the control signals are used to program the driver.

13. A system for controlling light emitting diodes (LEDs) coupled to an LED driver in response to a host providing LED control signals using a 1-wire communication protocol, the LED driver circuit comprising:

an LED controller coupled to the host to receive the LED control signals from the host; and wherein:
the LED control signals from the host are in pulse width modulation (PWM) format;
the LED control signals include binary information for programming the LED driver circuit;
the LED control signals include analog information for controlling the LED driver circuit;
each LED control signal includes a PWM preamble pulse and a PWM post-amble pulse; and
following the PWM post-amble pulse, the LED control signals are interpreted as LED control signals having analog information.

14. The system of claim 13, wherein the LED control signals include a PWM format shutdown signal that indicates a last LED control signal having analog information.

15. The system of claim 13, wherein LED control signals after the PWM preamble pulse and before the PWM post-amble pulse are interpreted as binary information.

16. The system of claim 15, wherein:
the LED control signals from the host in PWM format which have pulses of a first pulse length are interpreted by the LED controller as representing a first binary state; and
the LED control signals from the host in PWM format which have pulses of a second pulse length are interpreted by the LED controller as representing a binary state opposite to the first binary state.

17. The system of claim 16, wherein the LED control signals from the host in PWM format which have pulses of a third pulse length are interpreted by the LED controller as an interval between the first binary state and the opposite binary state.

18. The system of claim 13, wherein:
the LED controller interprets each LED control signal as a pair of signals, a first one of the pair of signals being a first pulse of a first polarity, and a second one of the pair of signals being a second pulse of opposite polarity;
the first pulse representing a rising edge of the LED control signal in PWM format; and
the second pulse representing a falling edge of the LED control signal in PWM format.

19. The system of claim 18, wherein following the post-amble pulse subsequent LED control signals are interpreted by the LED controller as average drive current to be provided by the driver circuit to a load circuit coupled to the LEDs.

20. A system for communicating with a driver using control signals over a 1-wire interface comprising:
a host coupled to the driver by the 1-wire interface, and wherein:
the host transmits control signals to the driver by the 1-wire interface for decoding by the driver;
the control signals include binary encoded command mode signals and analog encoded command mode signals, each of the binary encoded command mode signals and the analog encoded command mode signals being signals in a pulse width modulation (PWM) format;
the driver interprets the control signals during the binary encoded command mode as binary signals, and interprets the control signals during the analog encoded command mode as analog signals; and
each binary encoded command mode signal includes a preamble pulse, at least one command pulse, and a post-amble pulse, each binary encoded command mode signal beginning with the preamble pulse and ending with the post-amble pulse.

21. The system of claim 20, wherein the control signals received by the driver after the post-amble pulse are interpreted by the driver as analog encoded command mode signals.

22. The system of claim 21, wherein following the analog encoded command mode signals, a shutdown signal is sent by the host to indicate that all analog encoded command mode signals have been sent.

23. The system of claim 20, wherein the driver controller interprets each control signal as a PWM format signal in which a pair of signals represent a single pulse, a first one of the pair of signals being a first pulse of a first polarity, and a second one of the pair of signals being a second pulse of opposite polarity, the first pulse of the first polarity representing a rising edge of the single pulse and the second pulse of opposite polarity representing a falling edge of the single pulse.

24. The system of claim 23, wherein the driver controller interprets the binary encoded command mode signals as data for programming the driver and the analog encoded command mode signals as analog information representing values of parameters.

25. The system of claim 24 wherein during the binary encoded command mode the control signals are interpreted as a binary zero or binary one depending upon whether the pulse width is a first, shorter value or a second, longer value.

26. The system of claim 25, wherein during the binary encoded command mode, following each pulse the host waits for a fixed period before sending a next pulse.

27. The system of claim 26, wherein the host designates a change from the binary encoded command mode to the analog encoded command mode based on a width of the post-amble pulse.

* * * * *

UNITED STATES PATENT AND TRADEMARK OFFICE
CERTIFICATE OF CORRECTION

| | | |
|---|---|---|
| PATENT NO. | : 9,089,025 B2 | Page 1 of 1 |
| APPLICATION NO. | : 13/647139 | |
| DATED | : July 21, 2015 | |
| INVENTOR(S) | : Neyman et al. | |

It is certified that error appears in the above-identified patent and that said Letters Patent is hereby corrected as shown below:

In the claims

Column 13, line 16, the words --has been sent-- should be added at the end of claim 14.

The text of column 13, lines 14-16 should now read:

14. The system of claim 13, wherein the LED control
signals include a PWM format shutdown signal that indicates
a last LED control signal having analog information has been sent.

Column 14, line 28, the word "represent" should be changed to --represents--.

The text of column 14, lines 26-28 should now read:

23. The system of claim 20, wherein the driver controller
interprets each control signal as a PWM format signal in
which a pair of signals represents a single pulse, a first one of Signed and Sealed this
Eighth Day of December, 2015

Michelle K. Lee
*Director of the United States Patent and Trademark Office*